United States Patent [19]

Wisherd

[11] Patent Number: 5,272,450
[45] Date of Patent: Dec. 21, 1993

[54] DC FEED NETWORK FOR WIDEBAND RF POWER AMPLIFIER

[75] Inventor: David S. Wisherd, Sunnyvale, Calif.

[73] Assignee: Microwave Modules & Devices, Inc., Mountain View, Calif.

[21] Appl. No.: 717,844

[22] Filed: Jun. 20, 1991

[51] Int. Cl.$^5$ ............................................... H03F 1/00
[52] U.S. Cl. ..................................... 330/297; 330/306
[58] Field of Search ............... 330/297, 192, 305, 147, 330/148, 154, 306

[56] References Cited

U.S. PATENT DOCUMENTS

| | | | |
|---|---|---|---|
| 3,054,969 | 9/1962 | Harrison | 330/306 |
| 4,172,237 | 10/1979 | Rankin | 330/149 |
| 4,232,272 | 11/1991 | Fabri | 330/297 |
| 4,764,736 | 8/1988 | Usui et al. | 330/297 |
| 5,036,292 | 7/1991 | Hjelm et al. | 330/297 |

FOREIGN PATENT DOCUMENTS 2236028  3/1991  United Kingdom ................ 330/277

OTHER PUBLICATIONS

Transistor Band-Pass Amplifiers, Radio Corporation of America RCA, Victor Division, Dec. 15th 1949.

Primary Examiner—Robert J. Pascal
Assistant Examiner—Tan Dinh
Attorney, Agent, or Firm—Townsend and Townsend Khourie and Crew

[57] ABSTRACT

The frequency response of an RF power amplifier in a Cellular Phone Base station is improved by providing a shunt capacitor with the choke coil which interconnects a DC power source to the active device of the amplifier. The cutoff frequency of the bias network can be adjusted so that sum and difference frequencies of multiple-input signals are not attenuated by the feed network thereby permitting the sum and difference frequency signals to be shunted to ground. The linearity and bandwidth of the power amplifier is thus improved.

4 Claims, 3 Drawing Sheets

DC FEED NETWORK FOR WIDEBAND RF POWER AMPLIFIER

BACKGROUND OF THE INVENTION

This invention relates generally to RF power amplifiers, and more particularly the invention relates to an improved DC voltage feed network to a power amplifier thereby permitting improved wideband operation.

DC electrical power for an RF power amplifier is normally connected to a bipolar transistor collector or to an FET transistor drain through a coil or choke to minimize attenuation of the amplified carrier signal and loss of power in undesired heating of the choke. Referring to FIG. 1, the conventional circuit includes an RF bypass capacitor in the DC power source with the power source connected to the power amplifier active device through the choke which is represented by an inductance, $L_1$, and a small parasitic resistance $R_1$. An output matching network connects the power amplifier to the load, $R_L$.

The choke impedance $L_1$ is selected to be approximately 10 times or greater than the transformed value of the load impedance, $R_L$, at the point X, thereby eliminating any loading effect on the RF signal. The characteristics of any RF choke will vary with frequency, from characteristics resembling those of a parallel resonant circuit of high impedance, to those of a series resonant circuit where the impedance is lowest. In between these extremes the choke will show varying amounts of inductive or capacitive reactance and, the choke will also have a small amount of parasitic resistance, $R_S$. The idealized signal attenuation of the bias network shown in FIG. 1 is shown in FIG. 2 where $f_C$ is a cutoff frequency of the inductive network.

In a parallel feed circuit, the choke is shunted across the load and is subject to the full output RF voltage. If the choke does not present a relatively high impedance, sufficient power will be absorbed by the choke parasitic resistance to cause undesired heating and power loss. To avoid this, the choke must have a sufficiently high reactance to be effective at the lowest operating frequency and yet have no series resonances across the operating frequency band. An appropriate value capacitor, $C_1$, is used to shunt the DC input and decouple residual RF from the DC source.

Power amplifiers are used where the efficiency and output power of an amplifying circuit are important considerations. The various types of power amplifiers are identified by their classes of operation, i.e. classes A, B, C, D, E, F, G, H, and S. Except for class A, all of these amplifier types are easily differentiated from small signal amplifiers by their circuit configurations, methods of operations, or both. There is no sharp dividing line between small signal and class A power amplifiers, the choice of terms depends on the intent of the designer. Class A solid state power amplifiers are capable of providing highly linear amplification. However, they are considered cost prohibitive for high power transmitters (e.g. greater than 100 watts) because of relatively low power efficiency.

Class B or AB solid state power amplifiers do not have the high dynamic range linearity that class A solid state power amplifiers have. However, the power that the class B and AB amplifiers can provide is typically 3-5 times greater with far superior efficiency. A solid state device in a class A power amplifier is always biased fully on, which means the device will pull the same current through the bias network whether it is amplifying a large signal or a small signal. The transistor in a class B or AB power amplifier is biased so that it is only slightly on, it will pull from the bias network current in proportion to the signal driving the amplifier. When the amplifier is transmitting the highest average power, it will pull the required current needed to get full power out. However, when transmitting a signal has less average power, a significantly less amount of current will be drawn.

Class B and AB power amplifiers built with power semiconductor devices and operating with the classical bias scheme shown in FIG. 1 exhibit non-linearities that should be reduced if the output is to reproduce a multitone input signal with reasonable fidelity. When more than one tone are amplified simultaneously (e.g. signals $F_A$ and $F_B$) a frequency difference signal is generated ($F_{B-A}$). The bias network must not significantly attenuate either the DC current or the current at the difference frequency ($F_{B-A}$) at the output point X in FIG. 1. That is, the choke should filter out the difference frequency $F_{B-A}$. If a difference signal $F_{B-A}$ is attenuated by the choke, undesired distortions will be generated at the output of the amplifier.

The classical filter response as shown in FIG. 2 does not provide significant attenuation of the difference signal for a multi-tone input so long as the signals are close in frequency, as shown in FIG. 3A. However, in the case of Cellular Phone Base station amplifier signals, the frequency separation between $F_A$ and $F_B$ can be as much as 30 MHz, and therefore the difference signal may occur at a frequency that is high enough to fall in the attenuation band of the D.C. feed network as shown in FIG. 3B.

SUMMARY OF THE INVENTION

Accordingly, an object of the invention is an improved power amplifier having low distortion when multiple frequency signals are amplified.

Another object of the invention is an improved DC power feed network for a power amplifier which reduces signal distortion.

A feature of the invention is a parallel tuned circuit in the DC bias feed network which presents low impedance to frequency difference signals in a multiple frequency power amplifier and high impedance to the multiple frequency output signals.

The invention and objects and features thereof will be more readily understood from the following detailed description and dependent claims when taken with the drawing.

DETAILED DESCRIPTION OF ILLUSTRATIVE EMBODIMENTS

Figure 1:
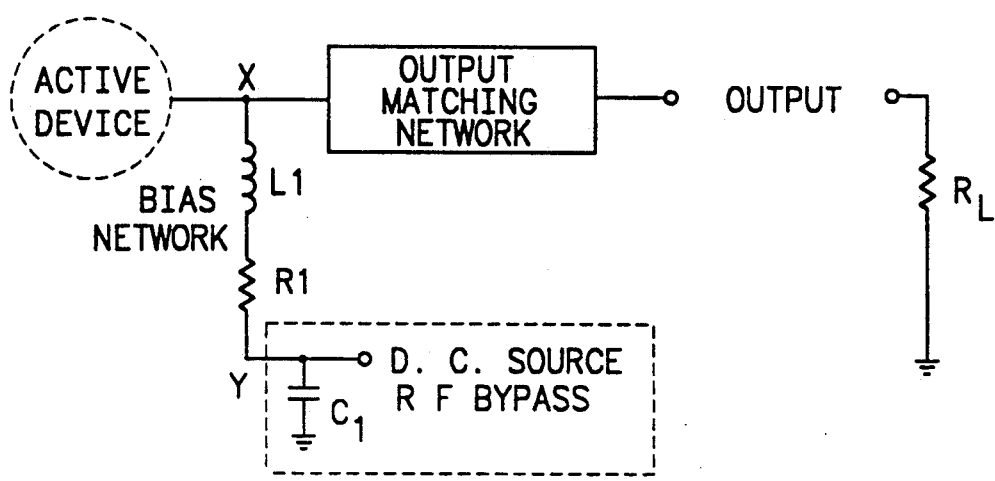
FIG. 1 is a schematic illustrating a conventional DC feed network for an RF power amplifier.
Figure 2:
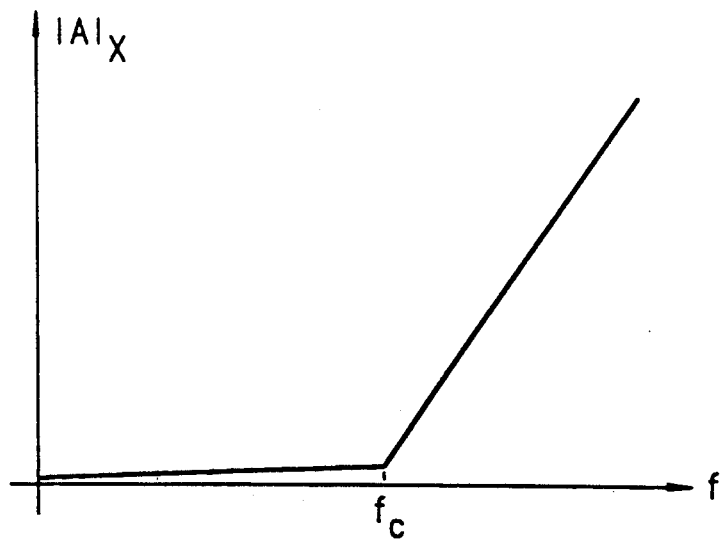
FIG. 2 is a graph illustrating the idealized characteristic attenuation, A, of the DC feed network of FIG. 1 where $f_C$ is the cutoff frequency of the inductive network.
Figure 3A:
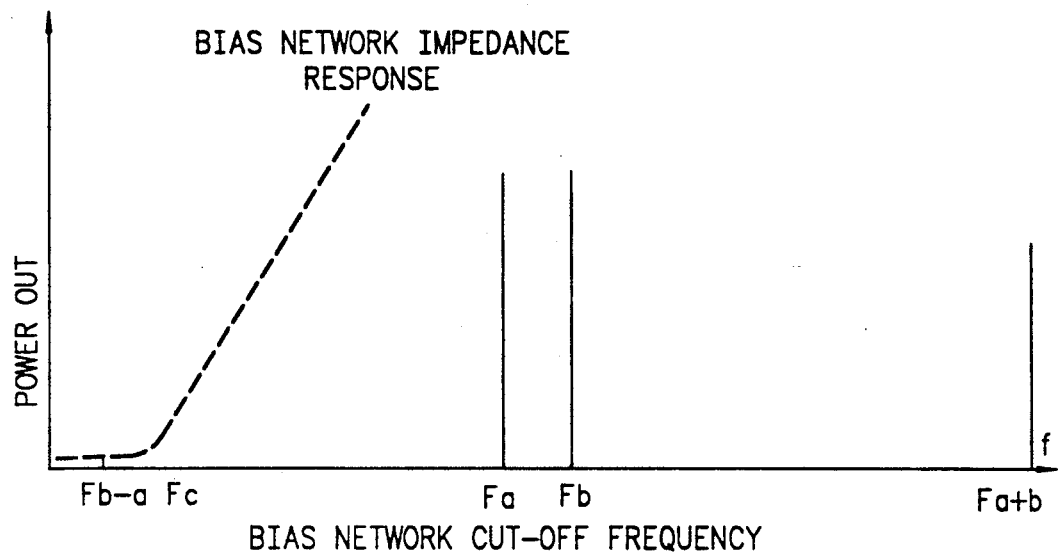
FIG. 3A is a graph illustrating the attenuation characteristics of a conventional feed network for a multiple frequency signal power amplifier in which the frequency difference signal $f_{B-A}$, lies outside of the cutoff frequency $f_C$.
Figure 3B:
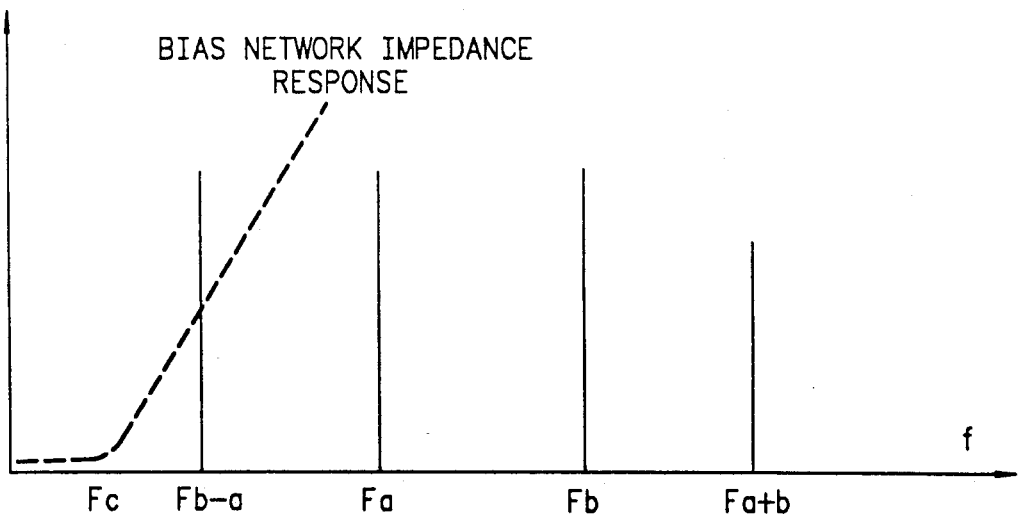
FIG. 3B is a graph illustrating the characteristics of a conventional feed network for a multiple frequency signal power amplifier in which the frequency difference signal $f_{B-A}$ lies inside the cutoff frequency, $f_C$.
Figure 4:
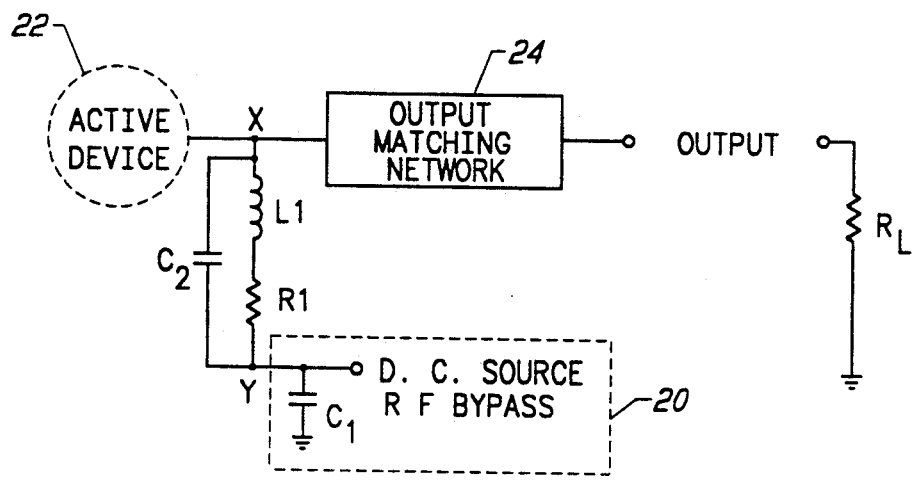
FIG. 4 is a schematic of a power amplifier and DC feed network in accordance with one embodiment of the invention.

Referring again to the drawings, FIG. 4 is a schematic illustrating a power amplifier and DC feed network in accordance with one embodiment of the invention. In this embodiment, the DC source shown generally at 20 including the RF bypass capacitor $C_1$ is serially connected to the active device 22 at the output point X by a parallel circuit including a capacitor $C_2$ and the choke coil illustrated by the inductance $L_1$ and the parasitic resistance $R_1$. In an alternative embodiment, a ground connection can be made at point Y of the DC feed network, also. The output of the active device 22 is connected through output matching network 24 to the load device (e.g. antenna) $R_L$.

Figure 5:
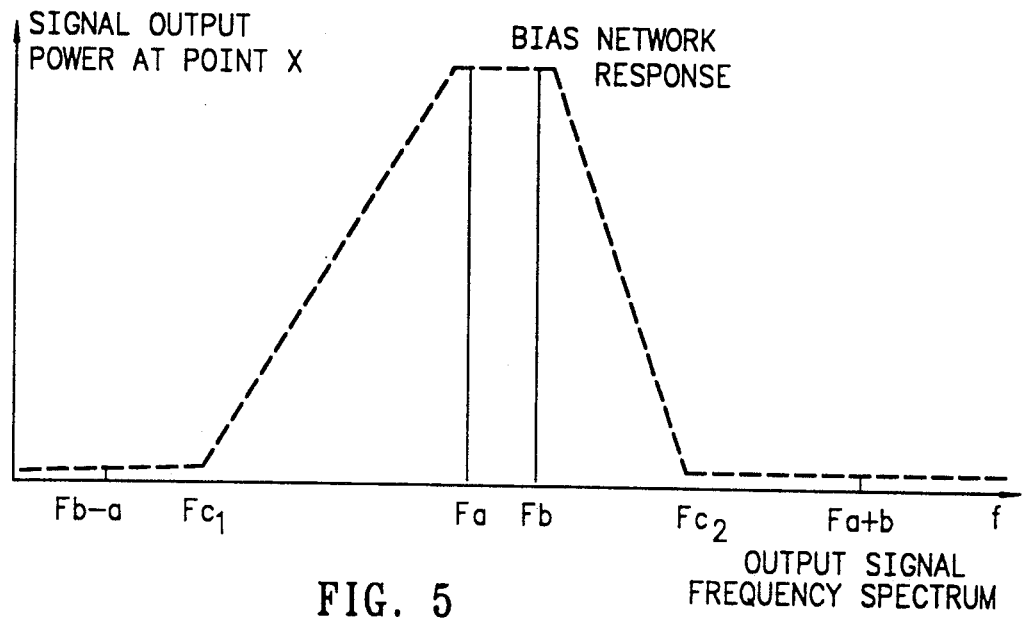
FIG. 5 is a graph illustrating the attenuation characteristics of the feed network of FIG. 4.

The parallel combination of capacitor $C_2$ and the choke coil, $L_1$ and $R_1$, selectively presents a high impedance to the output signals while letting the DC bias follow the difference signal amplitude to diminish distortion effects due to bias clipping in the amplifier when operated class B or AB, as shown in FIG. 5. The biased network response illustrated in the plot of FIG. 5 permits maximum signal output power for the multi-tone signals, fA and fB, while minimizing the power of the difference frequency, $f_{B-A}$, and the sum frequency, $F_{A+B}$, which lie outside of the cutoff frequencies $f_{C1}$ and $f_{C2}$ of the bias network. Accordingly, the sum and difference frequencies of the multi-input tones are effectively shunted to ground through RF bypass capacitor $C_1$ due to the frequency characteristics of the parallel circuit.

Figure 6:
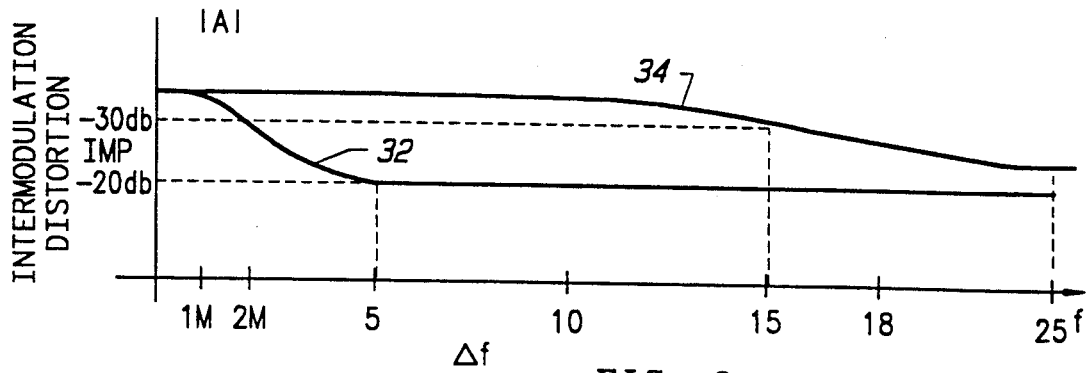
FIG. 6 is a generalized plot illustrating intermodulation distortion of the conventional power amplifier of FIG. 1 and of the power amplifier in accordance with the invention of FIG. 4.

The attenuation response of the bias network can be generalized as illustrated in the plot of FIG. 6 where the absolute value of intermodulation distortion is plotted against the difference frequency, $\Delta f$, between two input signals. The low frequency intermodulation distortion (i.e. $-35$ dB) is due to the active device. The increase in intermodulation distortion with frequency is due to the DC bias network. The response for a conventional feed network is shown at 32 in which the intermodulation distortion drops from $-30$ dB to $-20$ dB when the frequency difference increases from 0 to 5 MHz. On the other hand, the attenuation response of the bias network in accordance with the invention as illustrated at 34 maintains the $-30$ dB intermodulation distortion to approximately 15 MHz and does not drop to $-20$ dB until the frequency difference exceeds 25 MHz. Accordingly, it is seen that the operating characteristics of the power amplifier through use of a bias feed network in accordance with the invention broadens the video frequency bandwidth of a power amplifier while minimizing distortion of the amplifier signals. It will be appreciated that intermodulation distortion and attenuation response can be varied as a function of frequency difference depending on specific circuit design.

In one embodiment a class AB amplifier designed for use in a Cellular Phone base station transmitter operating in the frequency band from 865 MHz to 900 MHz was fabricated using a solid state RF power device. The amplifier had no less than 9 dB gain, 150 watts of output power, and more than 50% efficiency when operated at 26 volts DC bias voltage and excited with a single input tone through its frequency band.

There has been described a multiple frequency RF power amplifier having an improved wideband DC feed network. While the invention has been described with reference to a specific embodiment, the description is illustrative of the invention and is not to be construed as limiting the invention. Various modifications and applications may occur to those skilled in the art without departing from the true spirit and scope of the invention as defined by the appended claims.

What is claimed is:

1. A broadband multiple frequency CLASS AB RF power amplifier for multiple frequency input signals and having an active device with an output terminal and a DC power supply for the active device characterized by the DC power including an RF bypass capacitor connected to ground and serially connected to said output terminal of said active device through a parallel circuit including a choke coil and a capacitor, said choke coil and said capacitor establishing a cutoff frequency for RF signals which is higher than the difference frequency of said multiple frequency input signals whereby signals at the difference frequency are shunted to ground through said RF bypass capacitor.

2. An RF power amplifier for use in a Cellular Phone Base station in which multiple tone input signals are amplified, said amplifier comprising an output terminal for amplifying said multiple tone input signals, said active device having an output terminal, a load device, an output matching network interconnecting said load device and said output terminal, a DC power supply, a feed network connecting said DC power supply to said active device including an RF bypass capacitor connected to ground and serially connected to said output terminal through a parallel circuit including a choke coil and a capacitor, said parallel circuit providing low inductance to signals at the difference frequency of said multiple tone input signals whereby said signals at the difference frequency are shunted to ground through said RF bypass capacitor and intermodulation distortion is reduced.

3. The RF power amplifier as defined by claim 2 wherein said feed network has intermodulation distortion less than $-30$ dB for a difference frequency up to 10 mega hertz.

4. The RF power amplifier as defined by claim 2 wherein said DC bias feed network has a frequency response including a cutoff frequency higher than a difference frequency of two RF inputs to the RF power amplifier.

* * * * *